United States Patent
Hattori

(10) Patent No.: US 9,810,979 B2
(45) Date of Patent: Nov. 7, 2017

(54) IMPRINT APPARATUS AND ARTICLE MANUFACTURING METHOD

(75) Inventor: Tadashi Hattori, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1074 days.

(21) Appl. No.: 13/541,899

(22) Filed: Jul. 5, 2012

(65) Prior Publication Data

US 2013/0015597 A1 Jan. 17, 2013

(30) Foreign Application Priority Data

Jul. 15, 2011 (JP) .................................. 2011-157123

(51) Int. Cl.
*B29C 59/02* (2006.01)
*G03F 7/00* (2006.01)
(Continued)

(52) U.S. Cl.
CPC ............ *G03F 7/0002* (2013.01); *B82Y 10/00* (2013.01); *B82Y 40/00* (2013.01); *B29C 2059/023* (2013.01)

(58) Field of Classification Search
CPC ... B29C 35/0888; B29C 59/02; B29C 59/022; B29C 59/023; B29C 59/026;
(Continued)

(56) References Cited

U.S. PATENT DOCUMENTS 7,794,222 B2 * 9/2010 Suehira .................. B82Y 10/00
264/293
7,884,935 B2 * 2/2011 Suehira .................... B41M 3/00
101/485
(Continued)

FOREIGN PATENT DOCUMENTS

JP  2007281072 A  10/2007
JP  4-185941 B2  9/2008
(Continued)

OTHER PUBLICATIONS

Korean Office Action cited in Korean counterpart application No. KR10-2012-0073634, dated Jun. 9, 2014.
(Continued)

*Primary Examiner* — Alison L Hindenlang
*Assistant Examiner* — Emmanuel S Luk
(74) *Attorney, Agent, or Firm* — Rossi, Kimms & McDowell LLP

(57) ABSTRACT

An imprint apparatus includes: a first driving mechanism configured to move at least one of a mold holder and a substrate holder such that a mold and an imprint material are contact with each other; a second driving mechanism configured to move at least one of the holders such that the substrate is aligned with the mold; a measurement device configured to measure relative positions between a mold mark and a substrate mark in a state in which the mold and the imprint material are not in contact with each other; and a controller configured to control the second driving mechanism based on information of a relationship between a moving amount of at least one of the holders, and change in relative positions between the marks, information of the moving amount, and information of the measured relative positions.

11 Claims, 10 Drawing Sheets

(51) Int. Cl.
   *B82Y 10/00*   (2011.01)
   *B82Y 40/00*   (2011.01)

(58) Field of Classification Search
   CPC . B29C 59/16; B29C 2059/023; B29C 59/002;
       B29C 59/00; G03F 7/0002; G03F 9/703;
       G03F 9/7042; G03F 9/7049; G03F
       9/7065; G03F 9/7076; G03F 9/7084
   USPC ......................................... 425/150; 264/40.5
   See application file for complete search history.

(56) References Cited

U.S. PATENT DOCUMENTS

| | | | | |
|---|---|---|---|---|
| 8,765,034 B2* | 7/2014 | Takakuwa | ........... | G03F 7/70775 |
| | | | | 264/293 |
| 9,046,793 B2 | 6/2015 | Suehira et al. | | |
| 2004/0021866 A1* | 2/2004 | Watts | ................... | B29C 35/0888 |
| | | | | 356/401 |
| 2004/0219461 A1* | 11/2004 | Chung | .................. | B29C 33/303 |
| | | | | 430/311 |
| 2005/0275125 A1* | 12/2005 | Kawakami | ............. | B82Y 10/00 |
| | | | | 264/40.5 |
| 2006/0005657 A1* | 1/2006 | Choi | .................... | B29C 43/021 |
| | | | | 74/490.07 |
| 2006/0273488 A1* | 12/2006 | Seki | ........................ | B82Y 10/00 |
| | | | | 264/293 |
| 2007/0023684 A1* | 2/2007 | Lewis | ..................... | H01J 37/20 |
| | | | | 250/442.11 |
| 2007/0145639 A1* | 6/2007 | Seki | ........................ | B82Y 10/00 |
| | | | | 264/293 |
| 2009/0108483 A1 | 4/2009 | Suehira et al. | | |
| 2009/0170017 A1* | 7/2009 | Kitahara | ................ | G11B 5/855 |
| | | | | 430/30 |
| 2010/0072649 A1* | 3/2010 | Kawakami | ............. | B82Y 10/00 |
| | | | | 264/40.7 |
| 2010/0072653 A1 | 3/2010 | Kawakami et al. | | |
| 2010/0072664 A1* | 3/2010 | Kawakami | ............. | B82Y 10/00 |
| | | | | 264/293 |
| 2010/0078840 A1 | 4/2010 | Kawakami et al. | | |
| 2010/0238424 A1* | 9/2010 | Van Empel | ............. | G03F 7/709 |
| | | | | 355/72 |
| 2011/0074064 A1* | 3/2011 | Hayashi | ................. | B82Y 10/00 |
| | | | | 264/293 |
| 2011/0133354 A1* | 6/2011 | Kimura | .................. | B82Y 10/00 |
| | | | | 264/40.5 |
| 2011/0147970 A1 | 6/2011 | Sato | | |
| 2011/0266706 A1* | 11/2011 | Dijksman | ............. | G03F 7/0002 |
| | | | | 264/40.1 |
| 2012/0007279 A1* | 1/2012 | Torii | ..................... | B29C 33/303 |
| | | | | 264/293 |
| 2012/0061875 A1* | 3/2012 | Kono | .................... | B29C 59/022 |
| | | | | 264/293 |
| 2012/0286443 A1* | 11/2012 | Sato | ........................ | G01B 11/27 |
| | | | | 264/40.5 |
| 2013/0182236 A1* | 7/2013 | De Schiffart | ......... | B29C 43/021 |
| | | | | 355/74 |
| 2013/0193602 A1* | 8/2013 | Suzuki | .................. | B29C 59/002 |
| | | | | 264/40.1 |
| 2013/0241096 A1* | 9/2013 | Shudo | ................... | B29C 59/022 |
| | | | | 264/40.5 |

FOREIGN PATENT DOCUMENTS

| | | |
|---|---|---|
| KR | 20100035107 A | 4/2010 |
| TW | 201016443 A | 5/2010 |
| TW | 201107120 A1 | 3/2011 |
| TW | I329241 B | 3/2011 |

OTHER PUBLICATIONS

Taiwanese Office Action issued in Taiwanese counterpart application No. TW101123501, dated May 28, 2015. English translation provided.

\* cited by examiner

F I G. 10A
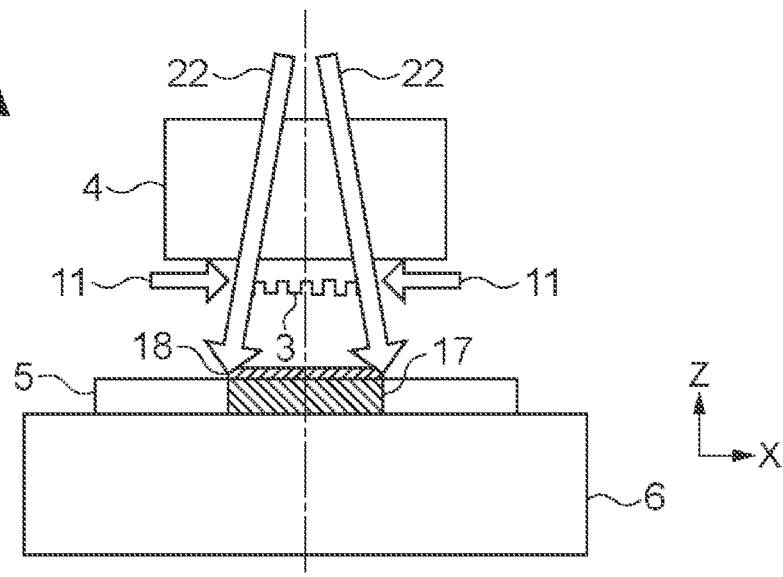
F I G. 10B
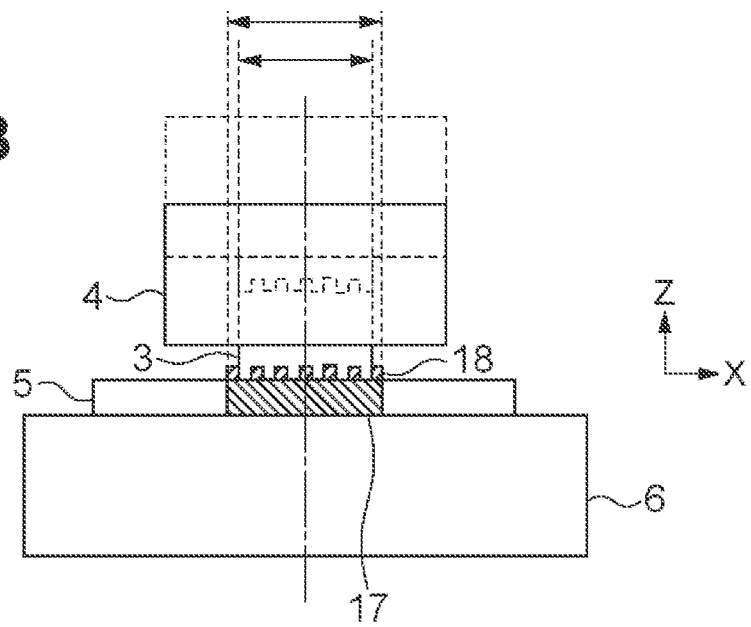

IMPRINT APPARATUS AND ARTICLE MANUFACTURING METHOD

BACKGROUND OF THE INVENTION

Field of the Invention

The present invention relates to an imprint apparatus, and a method of manufacturing an article using the imprint apparatus.

Description of the Related Art

Recently, the micropatterning of semiconductor devices has advanced, and imprint techniques of coating a substrate such as a wafer with a resist and curing the resist with an original (mold) being pressed against the resist are beginning to be used as semiconductor device manufacturing methods. A photo-curing method is one imprint technique. In an imprint apparatus using the photo-curing method, a region (shot region) as a pattern formation region on a substrate is first coated with a photo-curing resist. Then, alignment correction of the substrate and a mold is performed using a correction mechanism for correcting a mold size. Subsequently, the mold is pressed against the resist. After that, the resist is cured by ultraviolet irradiation, and the mold is released from the resist. Consequently, resist patterns are formed on the substrate. Japanese Patent No. 4185941 has disclosed an imprint apparatus for the photo-curing method.

In the imprint apparatus, patterns already formed on a substrate and a mold are aligned by using the die-by-die alignment method. When pressing the mold against each shot region in the die-by-die alignment method, a substrate mark and mold mark are observed using a TTM (Through The Mask) scope for directly measuring the marks through the mold, and a shift amount between them is measured and corrected. In the die-by-die alignment method, however, correct alignment is sometimes impossible because a mark shift caused by a process factor such as a decrease in amount of a film such as an underlayer is observed for each shot region.

By contrast, the global alignment method is most frequently used in conventional exposure apparatuses using a photolithography technique of transferring patterns of an original onto a substrate via a projection optical system. In the global alignment method, marks in several typical shot regions are measured, and a global index (coefficient) for obtaining the position of each shot is calculated by processing the measurement results. Then, each shot region is aligned based on the global index. In the global alignment method, alignment is performed using the same index. By conducting a sampling test on several shot regions in a post-process, therefore, it is possible to determine the quality of all shot regions of the substrate, and increase the productivity. It is also possible to avoid (reduce) the influence of an abnormal position shift caused by a process factor by properly selecting sample shot regions. This increases the stability of overlay accuracy. In the conventional exposure apparatus, the global alignment method is performed using an off-axis scope (OAS) installed in a position far from an exposure position. In the imprint apparatus, however, the global alignment method using the TTM scope is also possible. When adopting the global alignment method using the TTM scope, the OAS is no longer necessary, so the driving range of a substrate stage can be reduced. This makes it possible to decrease the size of the whole apparatus and reduce the cost.

When performing the global alignment method using the TTM scope in the imprint apparatus, measurement is performed by spacing a mold and substrate apart from each other to some extent. This spacing is normally about a few ten μm. This measurement performed with the mold and substrate being not in contact with each other but spaced apart from each other is called proximity measurement. If the optical axis of the TTM scope inclines to the driving direction of an imprint head, the imprint head shifts from the optical axis of the TTM scope while the head is driven by a few ten μm, even when imprinting is performed in a position aligned by global alignment. That is, imprinting is performed in a position different from an original position where a mark is seen. This decreases the overlay accuracy.

This similarly applies to the die-by-die alignment method. The die-by-die alignment method includes a contact method in which alignment is performed using the TTM scope with a mold and substrate being in contact with each other, a proximity method in which alignment is performed using the TTM scope before a mold and substrate are brought into contact with each other, and a method combining these two methods. In the contact method, an inclination difference between the optical axis of the TTM scope and the imprint head driving direction poses no problem. While a mold and substrate are in contact with each other, however, when a resist is filled in a mark position, the TTM scope is sometimes unable to measure the mark due to the refractive index of the resist. Also, while a mold and substrate are in contact with each other, the TTM scope can measure a shift amount between the mold and substrate, but there are some limitations, for example, a substrate stage cannot be moved very much. This makes the proximity method effective in the die-by-die alignment method as well. As in the global alignment method, however, the inclination difference between the optical axis of the TTM scope and the imprint head driving direction decreases the overlay accuracy when imprinting is performed.

SUMMARY OF THE INVENTION

The present invention provides, for example, an imprint apparatus advantageous for accurate overlay.

The present invention provides an imprint apparatus for performing an imprint process of forming a pattern on a substrate by molding an imprint material on the substrate using a mold, the apparatus comprising: a mold holder configured to hold the mold; a substrate holder configured to hold the substrate; a first driving mechanism configured to move at least one of the mold holder and the substrate holder along a driving axis such that the mold and the imprint material are contacted with each other; a second driving mechanism configured to move at least one of the mold holder and the substrate holder such that the substrate is aligned with the mold; a measurement device, which includes a scope for detecting, through the mold, a mold mark formed on the mold and a substrate mark formed on the substrate in a state in which the mold and the imprint material are not in contact with each other, configured to measure relative positions between the mold mark and the substrate mark; and a controller configured to control the second driving mechanism based on information of a relationship between a moving amount along the driving axis of at least one of the mold holder and the substrate holder, and change in relative positions between the mold mark and the substrate mark, information of the moving amount, and information of the relative positions obtained by the measurement device.

Further features of the present invention will become apparent from the following description of exemplary embodiments with reference to the attached drawings.

BRIEF DESCRIPTION OF THE DRAWINGS

FIGS. 10A and 10B are conceptual views showing the way a magnification error occurs under the influence of the inclinations of the optical axes of a plurality of scopes.

DESCRIPTION OF THE EMBODIMENTS

Figure 1:
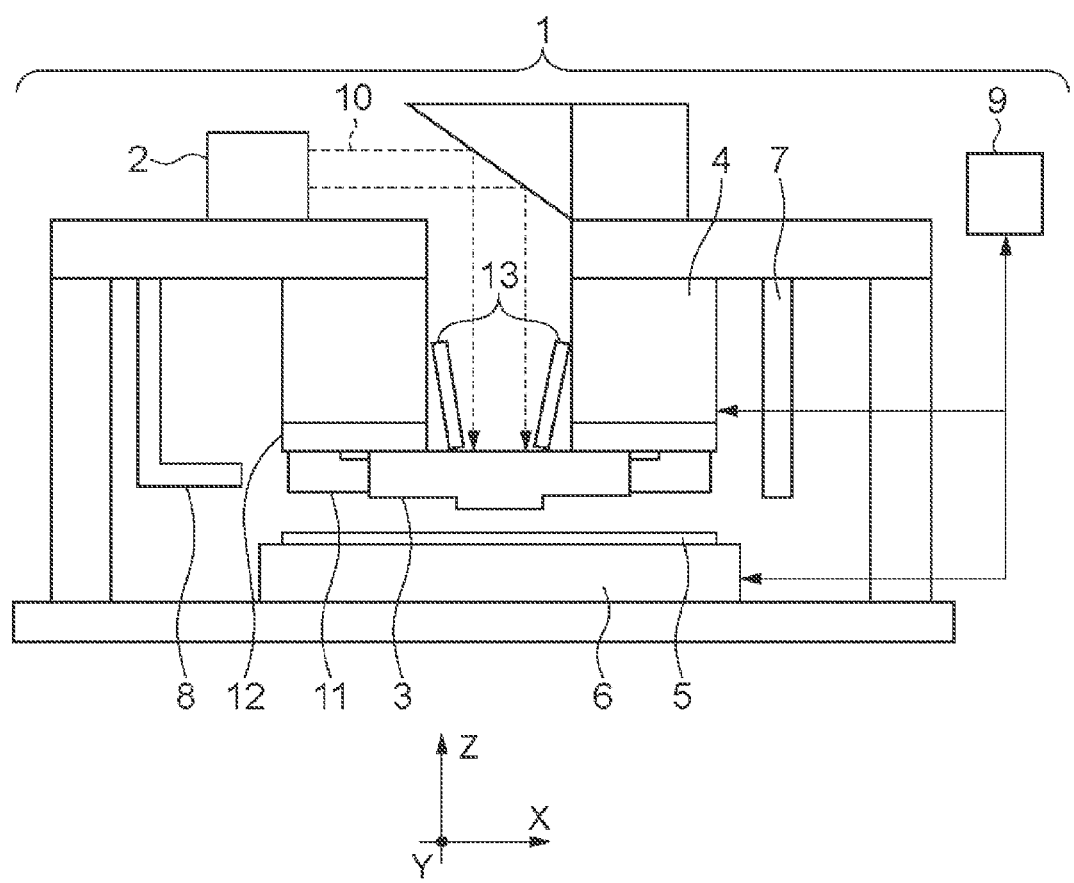
FIG. 1 is a view showing an imprint apparatus.

Embodiments of the present invention will be explained below with reference to the accompanying drawings. FIG. 1 shows an example of an imprint apparatus. The imprint apparatus of this embodiment is an imprint apparatus for a photo-curing method for performing, in each of a plurality of shot regions of a substrate, an imprint process of forming patterns by molding by using a mold and an imprint material (resist) applied on the substrate. The explanation will be made by taking, in the following drawings, the Z axis parallel to the axis of ultraviolet irradiation to the mold (the optical axis after the optical path of an illumination system 2 (to be described later) is bent), and the X and Y axes in two directions perpendicular to the Z axis and perpendicular to each other.

An imprint apparatus 1 includes the illumination system 2, a mold holder 4 for holding a mold 3 by a suction force or electrostatic force, a substrate stage (substrate holder) 6 for holding a substrate 5, a coating unit 7, a mold conveyance mechanism 8, and a controller 9. The substrate stage 6 can be positioned in a direction (first direction) parallel to the substrate surface. The illumination system 2 illuminates the mold 3 with ultraviolet light 10 in an imprint process. The illumination system 2 includes a light source, and a plurality of optical elements for adjusting ultraviolet light emitted from the light source into light appropriate for the imprint process. The mold 3 has predetermined three-dimensional patterns on a pattern surface opposing the substrate 5.

The imprint apparatus includes a correction mechanism 11 and scope 13. The correction mechanism 11 corrects at least a dimension in the X-axis direction of the pattern surface formed on the mold 3. The scope 13 is a TTM (Through The Mask) scope that measures a position shift amount between the substrate 5 and mold 3 by detecting substrate marks formed on the substrate 5 and mold marks formed on the mold 3 through the mold 3. The scope 13 can measure position shift amounts between the substrate 5 and mold 3 in the X and Y directions. The mold holder 4 is driven in the Z-axis direction in order to perform a mold pressing operation of pressing the mold 3 against a resist 18 applied on the substrate 5. After the resist 18 is cured, a mold releasing operation of releasing the mold 3 from the substrate 5 is performed by driving the mold holder 4 in the Z-axis direction. The mold pressing operation and mold releasing operation can be implemented by driving the mold holder 4 in the Z direction, and can also be implemented by driving the substrate stage 6 in the Z direction. A driving mechanism for driving at least one of the mold holder 4 and substrate stage 6 along a driving axis such that the mold 3 and resist 18 come in contact with each other is called a first driving mechanism. The mold holder 4 is also called an imprint head together with this driving mechanism.

The substrate stage 6 can hold the substrate 5 by vacuum suction, and can also position the substrate 5 in the X and Y directions. A driving unit of the substrate holder 6 forms a second driving mechanism for moving the substrate 6 in the X and Y directions so as to position a shot region with respect to the mold 3. However, the second driving mechanism need only move at least one of the substrate stage 6 and mold holder 4. The coating unit 7 coats the substrate 5 with an uncured resist (imprint material) 18. The resist 18 is a photo-curing resin that cures when receiving the ultraviolet light 10 from the illumination system 2. The mold conveyance mechanism 8 conveys the mold 3 and sets the mold 3 on the mold holder 4.

The controller 9 controls the operation of each unit of the imprint apparatus 1, and obtains the values of interferometers 15 and 16 and the like. The controller 9 is a computer or sequencer (not shown) connected to each unit of the imprint apparatus 1 by a line, and includes a memory. In this embodiment, the controller 9 determines an alignment correction value based on the position shift amount between the substrate 5 and mold 3 measured by the scope 13, and controls the correction mechanism 11 and substrate 6, thereby performing alignment correction. The controller 9 can be installed in the imprint apparatus 1, and can also be a remote controller installed outside the imprint apparatus 1.

Figure 2A:
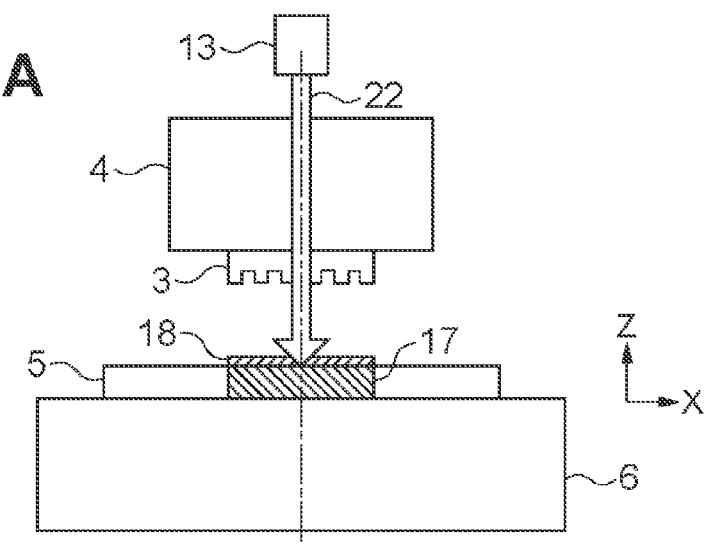
FIGS. 2A to 2C are views showing the relationship between a mold and substrate in an imprint process.
Figure 2B:
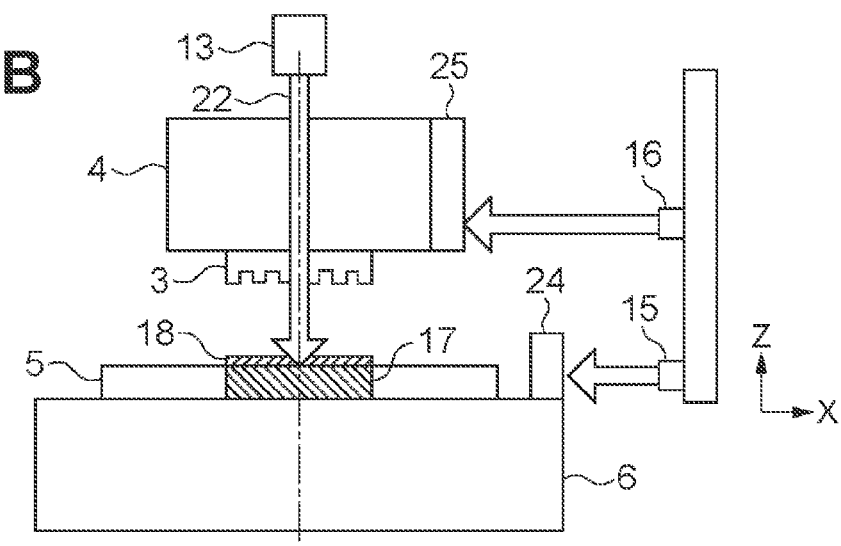
Figure 2C:
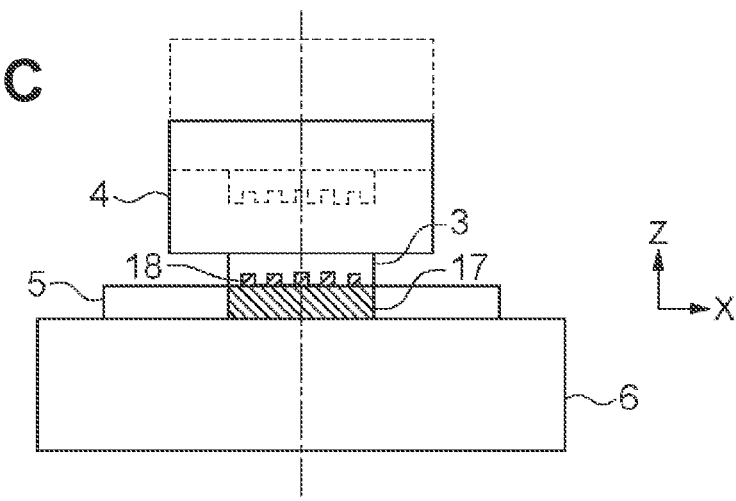

FIGS. 2A to 2C are conceptual views focusing attention on the mold 3 and substrate 5 in the imprint process. When the substrate 5 is mounted on the substrate stage 6, the scope 13 measures the layout of shot regions on the substrate 5 by alignment measurement. The alignment method is classified into the global alignment method and die-by-die alignment method. Details of these methods will be explained in the first and second embodiments. The scope 13 measures a mold mark and substrate mark while the pattern surface of the mold 3 and the resist 18 on the substrate 5 are not in contact with each other but spaced apart from each other by about a few ten µm. This measurement measures a position shift amount between the mold 3 and a shot region on the substrate 5. Reference numeral 22 denotes the optical axis of the scope during the measurement. When both the mold mark and substrate mark exist on the optical axis 22 indicated by an arrow, the two marks overlap each other. Normally, a plurality of scopes 13 detect a plurality of pairs of mold marks and substrate marks, thereby measuring a shift error, rotation error, and magnification error in the X and Y directions between the mold 3 and a shot region. For the sake of convenience, the explanation will be made by assuming that the scope 13 measures only a position shift in the X direction.

The imprint head normally has a driving axis in the Z direction. When the substrate stage 6 arrives at a target position, the imprint head is driven in the Z axis to press the mold 3 against the resist 18. FIG. 2C shows this imprinted state. High overlay accuracy can be obtained because a shot region on the substrate 5 and the mold 3 are aligned beforehand by the measurement by the scope 13.

Figure 3A:
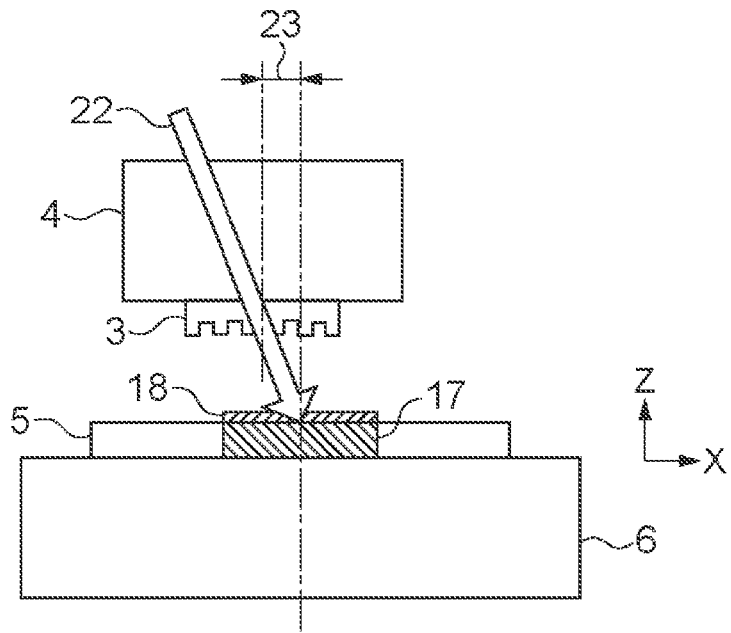
FIGS. 3A and 3B are views showing the way a position shift occurs between the mold and a shot region owing to the inclination of the optical axis of a scope.
Figure 3B:
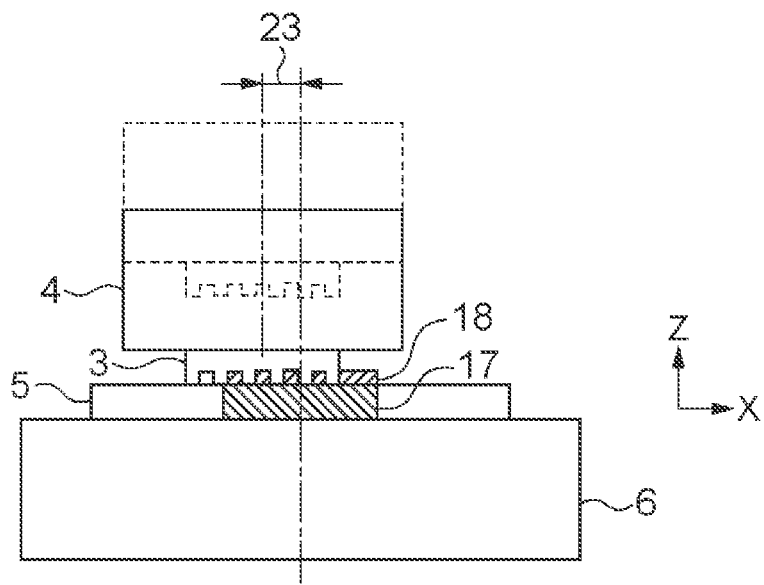

Assume that, as shown in FIG. 3A, the optical axis 22 of the scope has an inclination to the driving axis of the imprint head. Even in the state shown in FIG. 3A, the scope 13 detects by measurement that the mold mark and substrate mark are aligned. In this state, however, this measurement result is obtained because the optical axis of the scope 13 inclines, and a position shift 23 actually occurs between the center of the shot region on the substrate 5 and the center of the mold 3. Consequently, as shown in FIG. 3B, if the imprint process is actually performed in this state, imprinting is performed in a position shifted from the shot region on the substrate 5. This causes the decrease in overlay accuracy.

Note that in FIG. 3A, it is assumed for the sake of convenience that the optical axis 22 of the scope 13 inclines to the Z axis, and that the driving axis of the imprint head is parallel to the Z axis. However, exactly the same phenomenon occurs even when the optical axis 22 of the scope 13 is parallel to the Z axis and the driving axis of the imprint head inclines to the Z axis. In practice, the both do not have little inclination to the Z axis. It should be noted that the inclination of the optical axis 22 of the scope 13 with respect to the driving axis of the imprint head causes the decrease in overlay accuracy.

Figure 4:
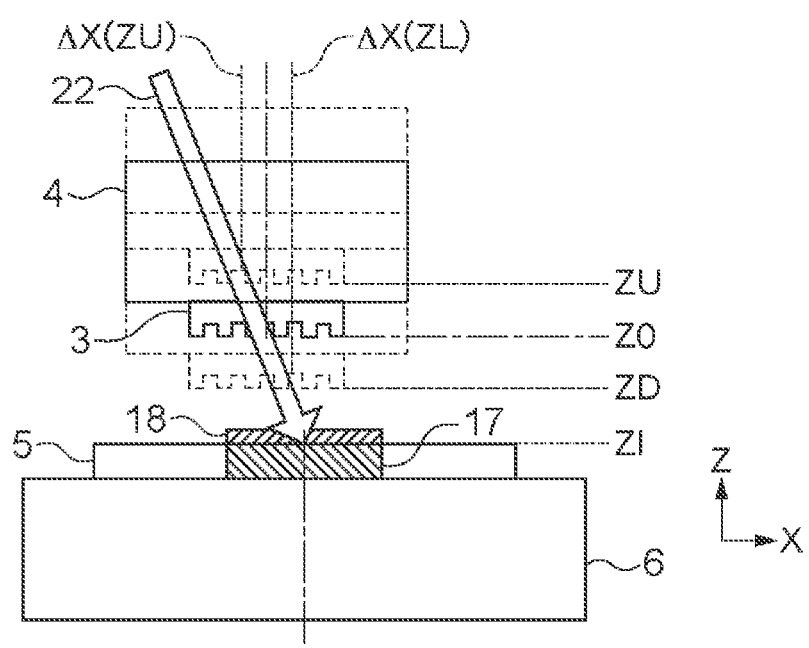
FIG. 4 is a conceptual view showing how to calculate the inclination of the optical axis of the scope.

To obtain high overlay accuracy, therefore, the inclination of the optical axis 22 of the scope 13 to the driving axis of the imprint head is first obtained before the substrate 5 for production is actually loaded into the apparatus or when performing the adjustment or maintenance of the apparatus. This will be explained with reference to FIG. 4. The substrate 5 on which a substrate mark is formed is mounted on the substrate stage 6. Also, the mold 3 on which a mold mark is formed is mounted on the imprint head. In this state, the substrate stage 6 is driven so as to overlay the substrate mark and mold mark with each other. Let Z0 be the Z position of the imprint head when the scope 13 observes the overlaid substrate mark and mold mark. When the Z position of the imprint head is Z0, a position shift amount between the mold mark and substrate mark measured by the scope 13 is 0 or nearly 0.

Figure 5A:
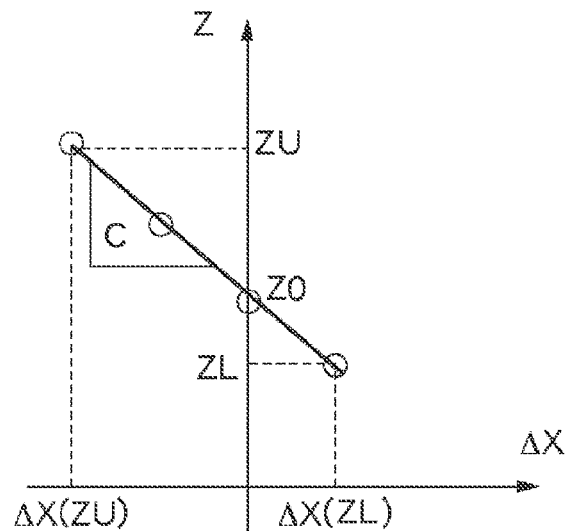
FIGS. 5A to 5C are conceptual views showing how to calculate the inclination of the optical axis of the scope and correct a position shift.
Figure 5B:
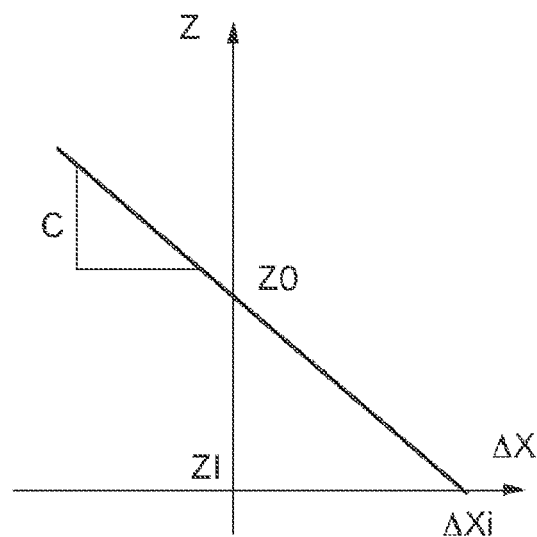
Figure 5C:
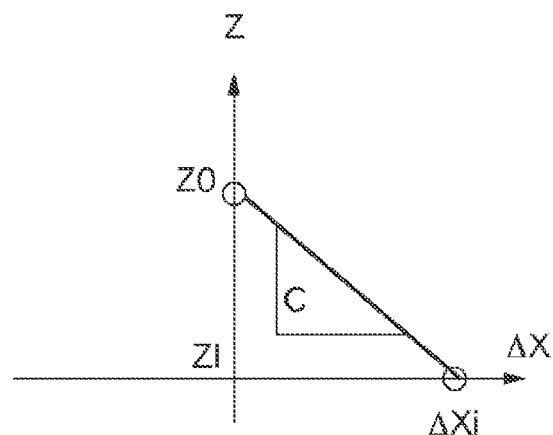

The imprint head is driven in the Z direction from this state. The driving range need only be a range within which the scope 13 is capable of measurement. The scope 13 for performing proximity measurement normally has a relatively low NA and a relatively large depth of focus. While the imprint head is driven in the Z direction within this measurable range, the scope 13 measures the mold mark and substrate mark. FIGS. 5A to 5C illustrate the relationship between the position of the imprint head in the Z direction and the measured value by the scope 13. Referring to FIGS. 5A to 5C, the ordinate is the Z axis to allow easy understanding of the relationship with FIG. 4. Also, the + direction (upward in the drawing surface) of the Z value is the direction in which the imprint head moves up, that is, the direction in which the mold 3 and substrate 5 separate from each other. For easy understanding, Z0 can be regarded as the position of the imprint head in the Z direction when the scope 13 performs normal measurement. The initial measurement position is Z0 in FIG. 4 as well.

ZU is the highest position (the Z value is in the + direction) of the imprint head within the measurable range of the scope 13. ZL is a position when the spacing between the mold 3 and substrate 5 is most narrowed, that is, a position when the Z position of the imprint head is driven downward (the Z value is in the − direction) so as not to bring the mold 3 and substrate 5 into contact with each other. Within this range, the Z position of the print head is driven, and the scope 13 performs measurement a plurality of times. In FIG. 5A thus obtained, a slope C indicates the inclination of the optical axis of the scope 13 to the driving axis of the imprint head.

A reference mark mounted on the substrate stage 6 may also be used instead of the substrate mark. Although the following explanation will be made by assuming, for the sake of convenience, that the substrate mark is measured, the present invention is not limited to this. Also, in the above description, the measurement value of the scope 13 is nearly 0 when the Z position of the imprint head is Z0. This is, of course, not an essential condition, and measurement may also be started from a given value. If measurement is started from a considerably large measurement value, however, the measurable range of the scope 13 may be exceeded or the reliability of the measurement value may decrease, when the imprint head is driven in the Z direction. Therefore, the measurement value is desirably started from nearly 0. Furthermore, the slope C is a primary slope in the above description, but the present invention is not limited to a primary slope, and it is also possible to use a function of higher order, correction table, or the like.

Then, a position shift amount ΔX in the X direction, which is expected when the imprint process is performed, is calculated from the slope C. The slope C is normally the slope of a linear function with respect to the Z position of the imprint head. In this case, a position shift amount in the X direction between the mold mark and substrate mark in each Z position of the imprint head is given by equation (1) below. In equation (1), ΔX(Z) is an expected value of the position shift amount in the X direction between the mold 3 and substrate 5 in the Z position of the imprint head. ΔX(Z0) is the measurement value of the scope 13 when the Z position of the imprint head is Z0. Z is the present Z position of the imprint head, and Z0 is the Z position of the imprint head when the scope 13 performs measurement.

$$\Delta X(Z) = \Delta X(Z0) + C \times (Z - Z0) \quad (1)$$

Letting ZI be the Z position of the imprint head when imprinting is performed, that is, when the mold 3 and substrate 5 come in contact with each other, a position shift amount between the mold 3 and a shot region on the substrate 5 during imprinting is given by equation (2) below. In equation (2), ΔXi is a position shift amount in the X direction between the mold 3 and the shot region on the substrate 5 during imprinting, and ZI is the Z position of the imprint head during imprinting.

$$\Delta Xi = \Delta X(ZI) = \Delta X(Z0) + C \times (ZI - Z0) \quad (2)$$

It is only necessary to estimate a position shift amount in the X direction between the mold 3 and substrate 5 in accordance with equation (1), and perform correction by driving the substrate stage 6 by this position shift amount. That is, after the position shift amount ΔX(Z0) between the mold 3 and substrate 5 is measured by the scope 13, the substrate stage 6 is driven in the X direction so as to correct ΔX(Z), as the Z position of the imprint head is driven. This driving for correction is desirably performed in real time as much as possible. When the Z position of the imprint head reaches the imprint position ZI, the driving amount of the substrate stage 6 is ΔXi, so imprinting can be performed in a correct position without any position shift between the mold 3 and the shot region on the substrate 5.

Figure 9:
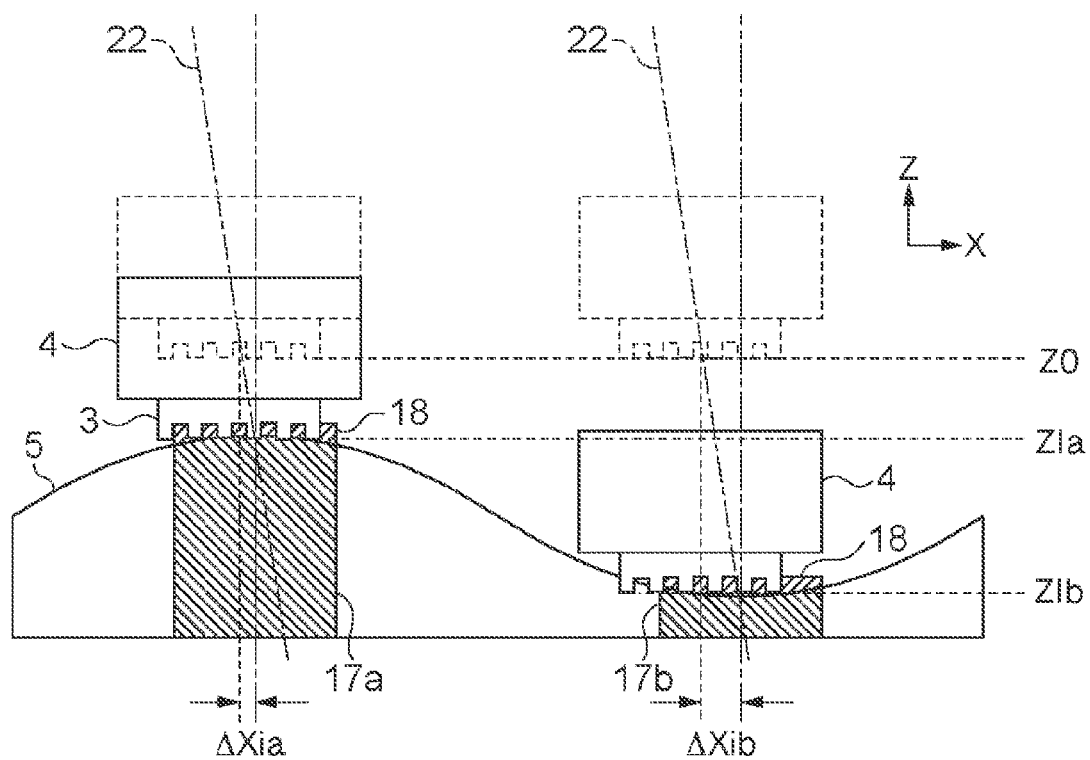
FIG. 9 is a conceptual view showing the way a position shift occurs between the mold and shot region because the thickness of a substrate is nonuniform.

If Z0 and ZI are always constant, the relationship between ΔX(Z0) and ΔX(ZI) is always constant, so the driving amount for correcting the substrate stage 6 can be constant. When using equation (2), however, even if the surface of the substrate 5 is uneven as shown in, for example, FIG. 9 and the Z position of the imprint head is different from ZI during imprinting, a correct correction amount ΔX can be obtained, so higher overlay accuracy can be obtained. In the example shown in FIG. 9, the Z position of the imprint head during imprinting is ZIa in given shot region A under the influence of the surface roughness of the substrate 5. Also, in given shot region B, the Z position of the imprint head during imprinting is ZIb. In this state, driving amounts ΔXia and ΔXib for correcting the substrate stage 6 in the X direction are represented by $$\Delta Xia = \Delta X(ZIa) = \Delta X(Z0a) + C \times (ZIa - Z0) \quad (2a)$$

$$\Delta Xib = \Delta X(ZIb) = \Delta X(Z0b) + C \times (ZIb - Z0) \quad (2b)$$

As described above, high overlay accuracy can be obtained by using equation (2) while avoiding the influence of the surface roughness of the substrate 5. ΔX(Z0a) and ΔX(Z0b) are position shift amounts in the X direction between the mold 3 and shot regions A and B measured by the scope 13 before imprinting. In the example shown in FIG. 9, the values of ΔX(Z0a) and ΔX(Z0b) are close to 0. Also, the influence of the difference between the thicknesses of the molds 3 which occurs when the molds 3 are exchanged can be corrected by using equation (1) without any problem, although a detailed explanation will be omitted. Note that Z0 in FIG. 5A and Z0 in FIG. 5B are the same for better understanding, but no problem arises even when they are different positions.

The method of driving the imprint head in the Z direction during imprinting has been explained above. However, it is also possible to drive the substrate stage 6 in the Z direction, instead of the imprint head, during imprinting. In this case, the Z axis in FIG. 5A represents the Z position of the substrate stage 6, and the slope C in FIG. 5A represents the inclination of the optical axis of the scope 13 to the driving axis of the substrate stage 6. The substrate stage 6 need only be driven for correction in the X direction in accordance with the Z position of the substrate stage 6. Furthermore, imprinting can also be performed by driving both the imprint head and substrate stage 6 in the Z direction. In this case, it is only necessary to use two parameters, that is, a slope C1 of the optical axis of the scope 13 to the driving axis of the imprint head, and a slope C2 of the optical axis of the scope 13 to the driving axis of the substrate stage 6. The position of the substrate stage 6 need only be corrected by using the sum of a correction amount depending on the Z position of the imprint head and a correction amount depending on the Z position of the substrate stage 6.

Referring to FIG. 5A, ZU and ZL are desirably separated from each other to some extent in order to accurately calculate the slope C. However, it is impossible to sufficiently separate ZU and ZL if the spacing between the mold 3 and substrate 5 cannot sufficiently be decreased, that is, if ZL cannot sufficiently be lowered, or if the depth of focus of the scope 13 is small. In this case, the scope 13 first normally performs measurement in a position where the Z position of the imprint head is Z0. In this state, the imprint process is performed. Then, the overlaid state of the imprinted patterns and an underlying shot region on the substrate 5 are measured by using an external measurement device or the like. Let ΔXi be a position shift amount in this state. The slope C can be calculated as indicated by equation (3) below. In equation (3), ΔXi is the position shift amount in the X direction between the imprinted patterns and the shot region on the substrate 5. ZI is the Z position of the imprint head when the imprint process is performed, and Z0 is the Z position of the imprint head when the scope 13 performs the measurement. (ZI−Z0) is the spacing in the vertical direction between the imprint head and substrate 5 when the measurement and imprint process are performed.

$$C = \Delta Xi/(ZI - Z0) \quad (3)$$

FIG. 5C shows the graph. Since the number of measurement points are only two, the measurement accuracy must be increased by, for example, using the average value of a plurality of shot regions.

The above explanation is based on the assumption that the direction of Z-driving of the imprint head is mechanically determined. In practice, however, it is difficult to mechanically stabilize Z-driving on a nanometer order. Especially in the global alignment method, the overlay accuracy immediately decreases if the direction of Z-driving of the imprint head fluctuates. As shown in FIG. 2B, therefore, an interferometer 16 for measuring position shifts in the X direction, Y direction, and rotational direction may be attached to the imprint head. The interferometer 16 measures the positions of the imprint head in the X direction, Y direction, and rotational direction. The interferometer forms a position measurement device that emits light in the X direction to a measurement target surface on a side surface of the imprint head, and receives light reflected by the measurement target surface, thereby measuring the relative position of the imprint head in the X direction with respect to the substrate stage 6. An encoder can also be used instead of the interferometer. To simplify the illustration, FIG. 2B shows only the interferometer 16 in the X direction. An interferometer 15 for measuring the position of the substrate stage 6 desirably performs the measurement based on the same standard as that of the interferometer 16. A measurement target surface 25 for the interferometer 16 is mounted on the imprint head. Likewise, a measurement target surface 24 for the interferometer 15 is mounted on the substrate stage 6. The measurement targets 24 and 25 are reflecting mirrors. That is, the positions of the imprint head in the X direction, Y direction, and rotational direction are not mechanically guaranteed, but a fluctuated amount is accurately measured and corrected by driving the substrate stage 6. In this arrangement, the direction of Z-driving of the imprint head is not a mechanically determined direction, but depends on the slope of the target surface 25 attached to the imprint head as a measurement target for the interferometer 16. The interferometers 15 and 16 form position measurement devices for measuring the positions of the mold holder 4 and substrate stage 6 via their side surfaces.

This phenomenon will be explained below with reference to FIGS. 6A and 6B. Assume that the optical axis 22 of the scope 13 is straight to the Z axis. Assume also that the driving axis of the imprint head is in the direction of the Z axis. In addition, assume that the target surface 25 to be measured by the interferometer 16 for measuring the position in the X direction of the imprint head has a given inclination to the Z axis. In this state, the imprint head performs Z-driving in order to perform the imprint process.

Therefore, the measurement value of the interferometer 16 includes an error ΔXi corresponding to the product of the inclination of the target surface 25 and the Z-driving amount of the imprint head. The controller 9 of the imprint apparatus supplies the error ΔXi to a substrate stage control system, and corrects the substrate stage 6 by driving it by ΔXi. The correction driving of the substrate stage 6 is originally correction driving for preventing the decrease in overlay accuracy. However, correction is performed in a direction to deteriorate overlay for the error ΔXi of the interferometer 16 for measuring the position in the X direction of the imprint head. When the driving axis of the imprint head has an inclination to the Z axis, the interferometer 16 for measuring the position in the X direction of the imprint head accurately measures this shift amount in the X direction. Accordingly, the position shift amount in the X direction caused by the inclination of the driving axis of the imprint head can accurately be reflected on the correction driving of the substrate stage 6. In the arrangement in which the interferometer 16 measures the position in the X direction of the imprint head, the driving direction itself of the imprint head poses no problem, and the position shift in the X direction is entirely the position shift caused by the inclination of the target surface 25 to be measured by the interferometer 16. In this case, therefore, the slope C represents the inclination of the optical axis 22 of the scope 13 to the target surface 25 to be measured by the interferometer 16. Since the correction driving of the substrate stage 6 is performed by using the value of the interferometer 16, the value of the interferometer 16 need only be corrected.

Figure 6B:
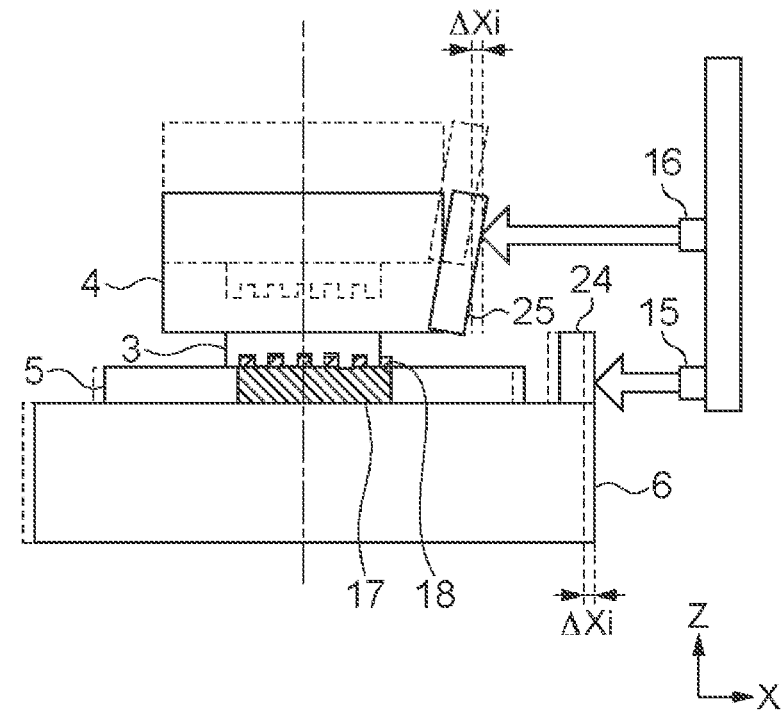
Figure 7A:
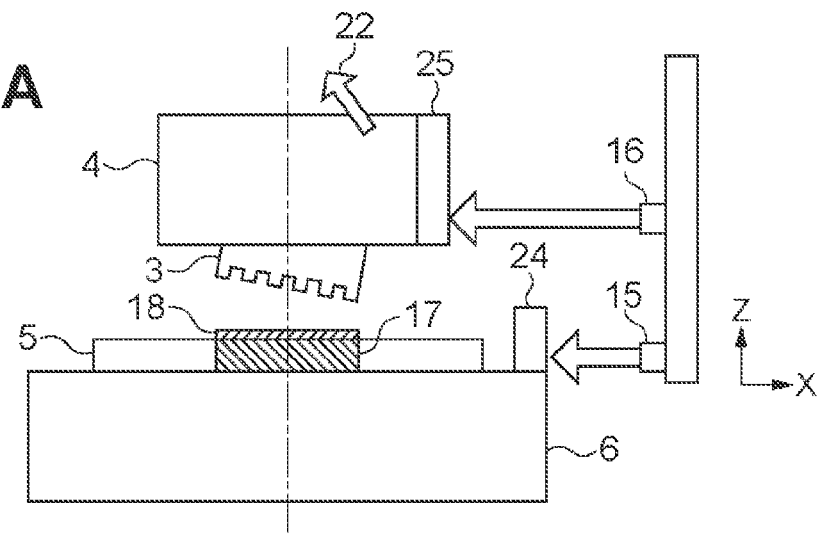
FIGS. 7A to 7C are conceptual views showing the way a position shift occurs between the mold and shot region when an imprint head is inclined in the first embodiment.
Figure 7B:
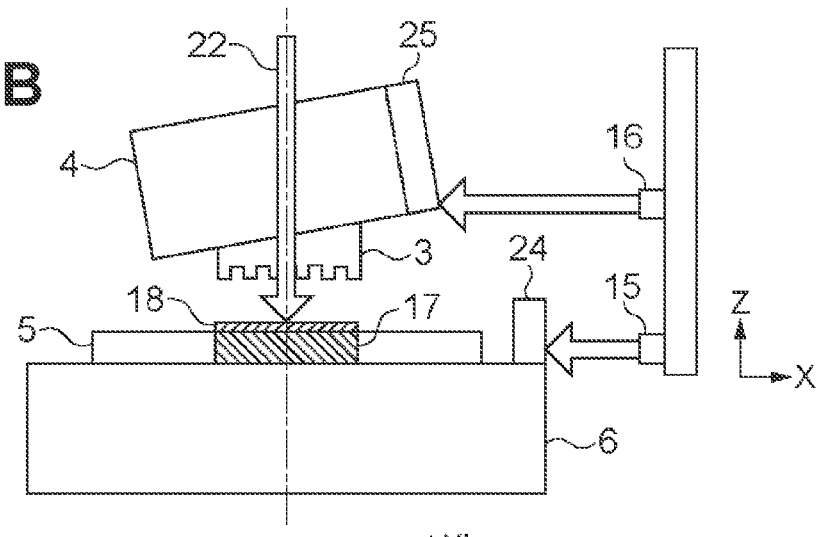
Figure 7C:
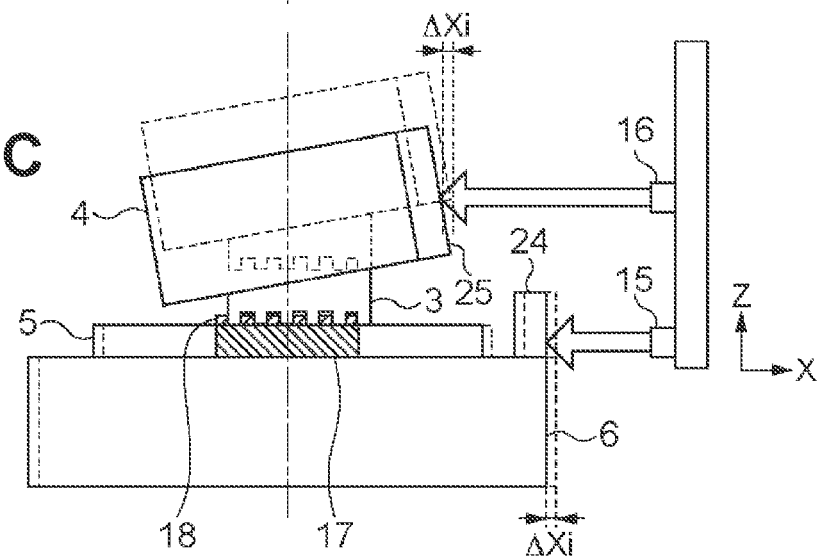

It should be noted that the component having inclined the imprint head also inclines the target surface 25 to be measured by the interferometer 16. FIG. 7A shows a state in which all of the optical axis 22 of the scope 13, the driving axis of the imprint head, and the target surface 25 to be measured by the interferometer 16 are parallel to the Z axis. That is, this state is an ideal state in which the slope C is 0, so imprinting can accurately be performed without any correction driving of the substrate stage 6. The mold 3 is mounted on the imprint head in this state. Assume that the mold 3 is attached to the imprint head with the surface of the mold 3 being inclined to the surface of the substrate 5. If the imprint process is performed by Z-driving of the imprint head in this state, the end face of the mold 3 comes in contact with the substrate 5. This makes it necessary to incline the imprint head in order to correct the inclination of the mold 3. Accordingly, the surface inclination of the mold 3 is measured by using, for example, an interferometer (not shown) for measuring the surface of the mold 3, and the surfaces of the mold 3 and substrate 5 are made parallel to each other by inclining the imprint head (FIG. 7B). In this state, the scope 13 measures the mold mark and substrate mark, and confirms that the position of the mold 3 matches the position of a shot region on the substrate 5. After that, the imprint process is performed by Z-driving of the imprint head (FIG. 7C). When the imprint head inclines, an inclination component is given to the target surface 25 to be measured by the interferometer 16 for measuring the X position of the imprint head. If Z-driving of the imprint head is performed in this state, the interferometer 16 is given the error ΔXi in the X direction in the same manner as in FIG. 6B. Since the substrate stage 6 performs wrong correction driving, the imprinted patterns shift by ΔXi from the position of the shot region on the substrate 5, in the same manner as in FIG. 6B.

Figure 6A:
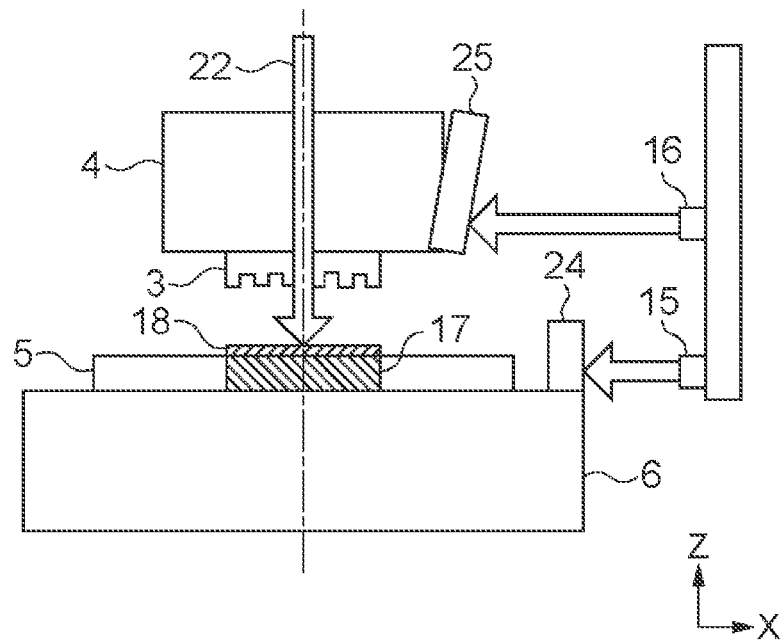
FIGS. 6A and 6B are conceptual views showing the way a position shift occurs between a mold and shot region in the first embodiment.

When the target surface 25 to be measured by the interferometer 16 initially has an inclination component as shown in FIG. 6A, this inclination component can be measured, so the controller 9 can achieve more accurate overlay by correcting a position shift caused by this inclination component. As shown in FIG. 7A, however, the inclination component of the imprint head is a component generated after the slope C is calculated. Accordingly, this inclination amount must be incorporated in addition to the slope C. Equation (4) below includes this inclination component of the imprint head. In equation (4), CI is the inclination amount of the imprint head.

$$\Delta X(Z) = \Delta X(Z0) + (C + CI) \times (Z - Z0) \qquad (4)$$

As described above, it is possible to correct the error caused by Z-driving of the imprint head by adding the inclination amount of the imprint head, thereby implementing good overlay.

Next, the timing at which the present invention is carried out will be described. The position shift between the mold 3 and substrate 5 is normally always corrected during imprinting. The slope C of the optical axis 22 of the scope 13 to the driving axis of the imprint head or substrate stage 6 is normally obtained when the imprint apparatus is activated or reactivated. This is based on the assumption that the value of the obtained slope C does not fluctuate. That is, both the inclination of the optical axis of the scope 13 and the inclination of the Z-driving direction of the imprint head must be stable. However, it is highly likely that a mechanical state like this fluctuates with time. Also, the mechanical state sometimes fluctuates in accordance with the apparatus state. If the slope C fluctuates with time, it is necessary to periodically reobtain the slope C. If the slope C fluctuates in accordance with the apparatus state, the slope C is reobtained when the apparatus state fluctuates.

The scope 13 is normally given the driving axis so that the scope 13 can move in the X and Y directions in accordance with the position of the substrate mark in a shot region. That is, when performing the imprint process on shot regions having different sizes, the positions of the substrate marks are also different. Therefore, the position of the scope 13 is driven in the X and Y directions in accordance with the position of the substrate mark, so that the substrate mark falls within the field of view of the scope 13. Also, when performing the imprint process on a partially chipped shot region such as a shot region in the periphery of the substrate 5 in the die-by-die alignment method, a substrate mark used in an unchipped shot region does not exist in some cases. In this case, another substrate mark in the shot region is used. The scope 13 must be moved to the position of the new substrate mark to be used in this case as well. When the scope 13 is thus moved, the inclination of the optical axis of the scope 13 may fluctuate before and after the movement. Therefore, the slope C can be remeasured when the scope 13 is moved.

Figure 8A:
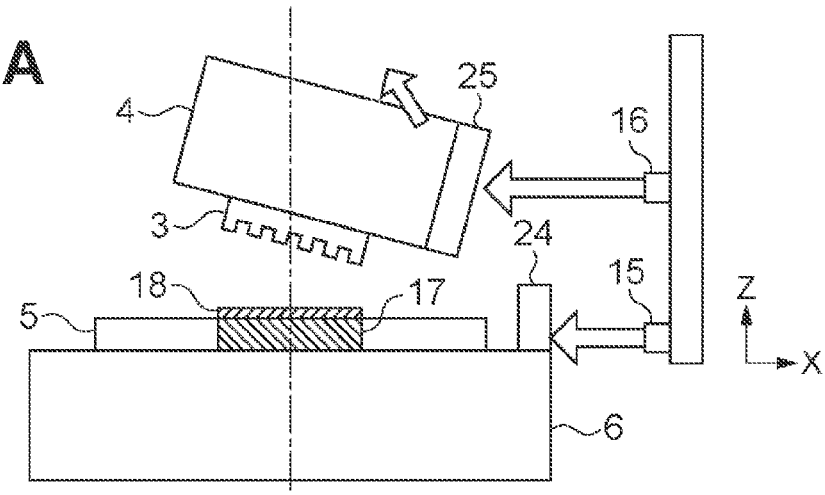
FIGS. 8A to 8C are conceptual views showing the way a position shift occurs between the mold and shot region when the origin of the inclination of the imprint head shifts in the first embodiment.
Figure 8B:
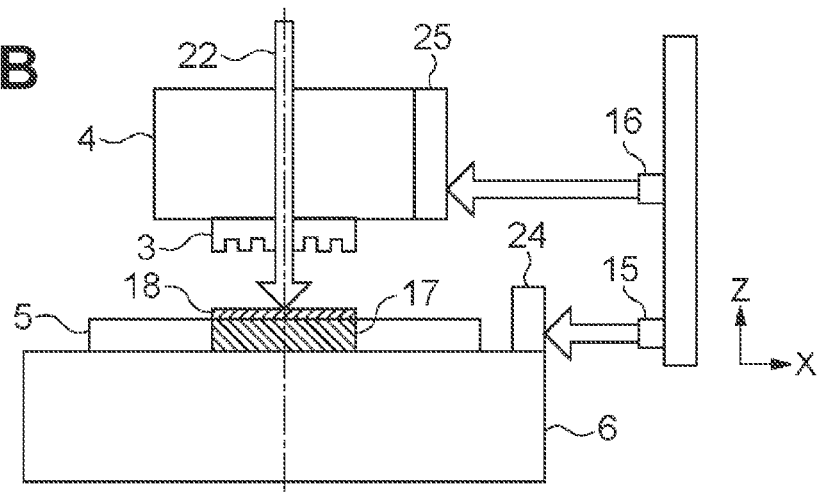
Figure 8C:
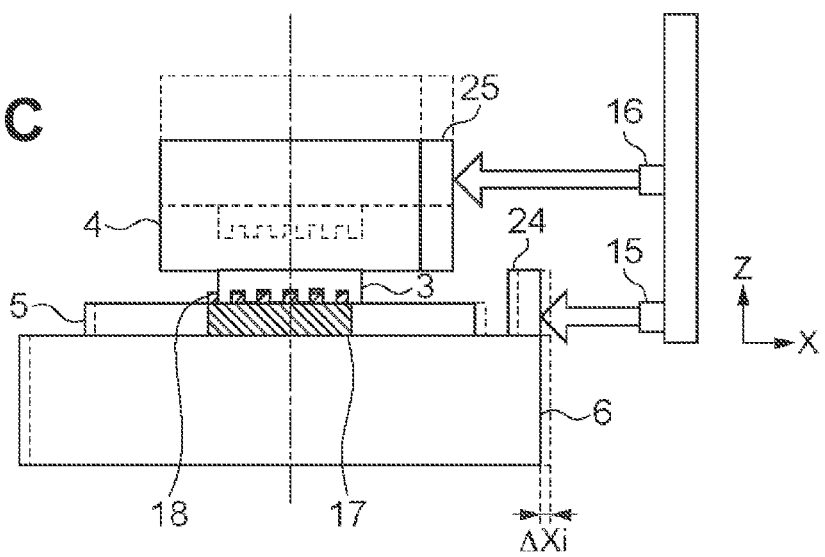

Similarly, when origin seek of the imprint head is performed, for example, when the apparatus is powered on or reset, the possibility that the inclination of the driving axis of the imprint head fluctuates is high. For easy understanding, assume that there is an interferometer for measuring the X and Y positions of the imprint head. Origin seek of the imprint head is performed immediately after the apparatus is powered on. Assume, as shown in FIG. 8A, that a state in which the imprint head has an inclination is used as the origin of the inclination of the imprint head. In this case, inclining driving of the imprint head is performed to make the surfaces of the mold 3 and substrate 5 parallel to each other, in the same manner as in FIGS. 7A and 7B. A driving mechanism for performing the inclining driving of the imprint head forms a third driving mechanism. Imprinting is performed in a state shown in FIG. 8B after the inclining driving of the imprint head is performed. If the optical axis of the scope 13 and the target surface 25 to be measured by the interferometer 16 are parallel to the Z axis, the overlay accuracy does not apparently decrease. When using equation (4), however, as shown in FIG. 8C, the substrate stage 6 performs extra correction driving by an amount corresponding to the inclination amount of the imprint head, and this makes it impossible to achieve accurate overlay. That is, since the position of the mold 3 matches the position of the shot region on the substrate 5, $\Delta X(Z0)=0$, $C=0$, and $Z=ZI$ as the Z position during imprinting are substituted into equation (4), so equation (4) is deformed into equation (5) below, thereby producing an error $\Delta Xi$.

$$\Delta Xi = \Delta X(ZI) = CI \times (ZI - Z0) \qquad (5)$$

Although CI is apparently 0 in FIG. 8C, the inclination angle CI of the imprint head is the inclination amount (inclination angle) of the inclination of the imprint head from the origin (initial inclination angle). Therefore, when the origin of the inclination of the imprint head is shifted as shown in FIG. 8A, CI has a certain value in FIG. 8C. Accordingly, $\Delta Xi$ is not 0, and the substrate stage 6 performs extra correction driving.

Equation (6) is obtained, therefore, by rewriting equation (4) by adding the origin of the inclination of the imprint head.

$$\Delta X(Z) = \Delta X(Z0) + (C + \{CI - C0\}) \times (Z - Z0) \qquad (6)$$

where C0 is the inclination amount after origin seek of the imprint head is performed, and CI is the driving amount based on the origin of the imprint head.

Accordingly, it is necessary to obtain the origin C0 of the inclination of the imprint head. One method is to recalculate the slope C. That is, when a new slope C' is measured, equation (4) is rewritten into equation (7) below.

$$\Delta X(Z) = \Delta X(Z0) + (C' + CI) \times (Z - Z0) \text{ for } C' = C - C0 \qquad (7)$$

That is, the new slope C' includes a shift of the origin of the inclination of the imprint head. When the new C' is calculated, C0, that is, the shift of the origin of the inclination of the imprint head is known because the slope C is known. More specifically, if origin seek of the imprint head is performed at the timing at which the origin of the inclination of the imprint head fluctuates, for example, when the apparatus is activated or reset, high overlay accuracy can be obtained by calculating the new slope C'.

In the above explanation, a substrate on which a substrate mark is formed is used. When frequently calculating the slope C, however, a mark to be measured by the scope 13 is desirably preformed on the substrate stage 6. Note that to allow easy understanding of the concept of the inclination of the imprint head, the arrangement including the interferometer 16 as shown in FIG. 2B has been explained. However, the process is exactly the same even when there is no interferometer 16.

X-direction position shift correction in Z-driving of the imprint head has been explained above. The same explanation applies to correction in the Y direction. Also, when correcting a shape difference and rotation between the mold 3 and a shot region on the substrate 5 by using a plurality of scopes 13, these factors are amounts obtained from X-direction position shifts and Y-direction position shifts of a plurality of marks. Since the shape of a shot region cannot be corrected by moving the substrate stage 6, the correction mechanism 11 (shown in FIG. 1) for correcting the pattern surface dimensions is used. This will be explained with reference to FIG. 10A. The magnification in the X direction of a shot region can also be measured by preparing two scopes 13 (first and second scopes) for measuring positions in the X direction. When the inclinations of the optical axes 22 of the two scopes 13 are the same, an error of $\Delta X$ depending on the Z position of the imprint head appears. If the inclinations of the two scopes 13 are different as shown in FIG. 10A, however, the two scopes 13 do not perform measurement so that the mold mark and substrate mark match, unless the correction mechanism 11 decreases the pattern surface dimensions of the mold 3.

If imprinting is performed by Z-driving of the imprint head in this state, however, patterns smaller than the shot region on the substrate 5 are imprinted as shown in FIG. 10B. Therefore, the inclination of the optical axis of each of the scopes 13 is calculated, and the X and Y shifts, rotation, and magnification (shot region shape) during imprinting are also calculated and corrected based on the inclinations of all the scopes 13. In the example shown in FIG. 10A, the inclinations of the optical axes of the two scopes 13 are different, so a magnification error occurs in accordance with the Z position of the imprint head. Accordingly, the magnification need only be corrected in accordance with the Z position of the imprint head, in the same way as that for equation (4). That is, when the number of scopes 13 is two, the average value of the inclinations of the optical axes of the two scopes 13 is the inclination of the shift amount of X, and the difference between the inclinations of the two is the inclination of the magnification. This exactly applies to other components, and the number of correctable shapes of the mold 3 increases as the number of scopes 13 increases. For example, when mold marks for both the X and Y directions are formed at the four corners of the mold 3, it is possible to correct errors in the X direction, Y direction, and rotational direction, and process a shot region having the shape of a parallelogram or trapezoid. Generally, errors in the X direction, Y direction, and rotational direction are corrected by moving the substrate stage 6, and shape errors are corrected by driving the correction mechanism 11. However, errors in the X direction, Y direction, and rotational direction can also be corrected by shifting the position of the mold 3 by using the correction mechanism 11. When the imprint head itself includes driving mechanisms for the X direction, Y direction, and rotational direction, other than the correction mechanism 11, correction may also be performed by using these driving mechanisms. Each alignment method in the imprint process performed by the imprint apparatus will be described below.

First Embodiment

As the first embodiment, the global alignment method using the scope 13 will be explained below. In the global alignment method, the layout of shot regions on the entire substrate 5 is calculated by measuring the positions of a plurality of sample shot regions on the substrate 5, and the reference used in the calculation is the position reference of the substrate stage 6. Therefore, the position measurement of the substrate stage 6 requires high accuracy. Accordingly, a general approach is to measure the position of the substrate stage 6 by using the interferometer 15 as shown in FIG. 2B. Also, overlay deteriorates if the position of the imprint head shifts in the X and Y directions after the sample shot regions are measured by the global alignment method. Therefore, it is desirable to measure position shifts of the imprint head in the X direction, Y direction, and rotational direction by using the interferometer 16. Imprint head position information measured by the interferometer 16 is supplied to the controller 9, and the controller 9 corrects the position of the substrate stage 6, thereby achieving more accurate overlay.

When the substrate 5 is mounted on the substrate stage 6, the scope 13 measures the layout of shot regions on the substrate 5 by global alignment measurement. In this process, the mold 3 and substrate 5 are measured in a non-contact state with a spacing of about a few ten μm being formed between them. This measurement is performed on the sample shot regions. Based on this information, the layout of the shot regions on the substrate 5 is calculated. When actually performing imprinting after that, the position of a shot region 17 to be imprinted is calculated based on the previous shot region layout information, and the substrate stage 6 is moved such that the target shot region comes to the imprint position. When the substrate stage 6 arrives at the target position, the imprint head is driven in the Z direction to press the mold 3 against the resist 18. The resist 18 can be applied immediately before imprinting, or applied on the entire substrate 5 beforehand. When the mold 3 is pressed against the resist 18, the resist 18 is cured by irradiation with light after the resist 18 is filled in patterns of the mold 3. After that, the mold 3 is released from the substrate 5 by driving the imprint head upward in the Z direction. The series of operations described above are performed on all shot regions on the substrate 5. FIG. 2C shows the imprinted state.

As shown in FIG. 6A, an inclination difference normally exists between the optical axis 22 of the scope 13 and the target surface 25 to be measured by the interferometer 16. For the sake of convenience, FIG. 6A shows the state in which the optical axis 22 of the scope 13 is parallel to the Z axis, and the measurement target surface 25 of the interferometer 16 inclines to the Z axis. This inclination prevents accurate overlay. Accordingly, it is necessary to calculate and correct the inclination difference between them. In the global alignment method, the measurement value of the interferometer 16 is corrected. If the surface of the mold 3 or the surface of the substrate 5 inclines as shown in FIG. 7A, inclination driving of the imprint head must be performed to make the surfaces of the mold 3 and substrate 5 parallel. In this process, the measurement target surface 25 of the interferometer 16 also inclines, so the interferometer 16 has an error. Therefore, correction must be performed by including this inclination amount of the imprint head. A general imprint apparatus has a mechanism in which the imprint head performs Z-driving. However, it is also possible to use a mechanism in which imprinting is performed by performing Z-driving by the substrate stage 6. When processing a given lot by an apparatus, a test is normally conducted in advance by supplying the lot. In this step of testing the lot in advance, therefore, it is possible to actually perform imprinting, and calculate the inclination amount of the imprint head by using the value of the overlay accuracy obtained by the test. That is, the slope C can be calculated from the difference between a shift amount when the scope 13 measures a mark and a shift amount when imprinting is performed, and from the moving amount in the Z direction of the imprint head. During global alignment measurement, it is also possible to measure a plurality of points in a shot region, and calculate and correct the distortion of the shot region. When measuring a plurality of marks by a plurality of scopes 13, it is possible to correct not only a shift of the imprint position in Z-driving of the imprint head, but also the shape of patterns to be imprinted. As an example, FIG. 10A shows the way a magnification error occurs during imprinting when using two scopes 13. The present invention can accurately correct this magnification error as well.

Although the slope C is obtained when adjusting the apparatus, it is desirable to obtain the slope C when there is the possibility that the apparatus state changes. That is, if the positions of marks on the mold 3 and substrate 5 change when a lot changes, the position of the scope 13 must be changed in accordance with the mark positions. Also, when origin seek of the interferometer 16 for measuring the position of the imprint head is performed, the relationship between the inclinations of the optical axis 22 of the scope 13 and the measurement target surface 25 of the interferometer 16 may change. In a case like this, it is desirable to recalculate the slope C.

Second Embodiment

In the first embodiment, imprinting using global alignment is described. The present invention is also applicable to imprinting using the die-by-die alignment method.

When using the die-by-die alignment method, as shown in FIG. 2A, a general approach is to align a shot region on the substrate 5 and the mold 3 by using the scope 13 immediately before imprinting. The substrate stage 6 is moved so that the scope 13 detects that a mark on the mold 3 matches a mark in the shot region on the substrate 5. When imprinting is performed in this state, patterns of the mold 3 can be overlaid on the shot region. Since the scope 13 can measure a mechanical position shift of the imprint head, the interferometer 16 used in the global alignment method is unnecessary.

If both the scope 13 and the direction of Z-driving of the imprint head have inclinations as shown in FIG. 3A, imprinted patterns shift from a shot region on the substrate 5 even when imprinting is performed after alignment is performed by using the scope 13. This prevents accurate overlay. When correcting a shape in a shot region, a plurality of scopes 13 are prepared, and the inclinations of the scopes 13 are obtained. It is, of course, desirable to use the interferometer 16 although it is not essential. This is so because the direction of Z-driving of the imprint head as shown in FIG. 3A is determined by a mechanical factor, and hence can fluctuate to some extent. The arrangement as shown in FIG. 2B is unaffected by the direction of Z-driving of the imprint head, so the slope C is obtained from the relationship between the measurement target surface 25 of the interferometer 16 and the optical axis of the scope 13.

In the die-by-die alignment method, some substrate marks may be unusable in a partially chipped shot region positioned in the periphery of the substrate 5. In this case, another substrate mark must be measured by driving the scope 13. When the scope 13 is driven, however, the optical axis 22 of the scope 13 may fluctuate. Therefore, it is desirable to reobtain the slope C. Note that shot regions in the periphery of the substrate 5 are not evenly chipped, it is sometimes necessary to drive the scope 13 for each shot region. Since it takes a long time to reobtain the slope C whenever the scope 13 is driven, it is necessary to, for example, perform imprinting on the shot regions in the periphery of the substrate 5 lastly after imprinting on unshipped shot regions is complete. The rest is the same as that of the global alignment method, so details will be omitted.

As has been described above, the imprint apparatus of this embodiment achieves more accurate overlay and increases the productivity regardless of whether the global alignment method or die-by-die alignment method is used.

Embodiment of Article Manufacturing Method

A method of manufacturing a device (for example, a semiconductor integrated circuit device or liquid crystal display device) as an article includes a step of transferring (forming) patterns onto the substrate (wafer, glass plate, or film-like substrate) 5 by using the above-described imprint apparatus. This manufacturing method can further include a step of etching the substrate 5 on which the patterns are transferred. Note that when manufacturing another article such as a patterned medium (recording medium) or optical element, the manufacturing method can include another step of processing the substrate 5 on which the patterns are transferred, instead of the etching step. The article manufacturing method of this embodiment is superior to the conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-157123 filed Jul. 15, 2011, which is hereby incorporated by reference herein in its entirety.

What is claimed is:

1. An imprint apparatus for performing an imprint process of forming a pattern on a substrate by molding an imprint material on the substrate with a mold, the apparatus comprising:
   a mold holder configured to hold the mold;
   a substrate holder configured to hold the substrate;
   a first driving mechanism configured to move at least one of the mold holder and the substrate holder along a driving axis such that the mold and the imprint material are brought into contact with each other;
   a second driving mechanism configured to move at least one of the mold holder and the substrate holder along a plane with which the driving axis intersects, such that the substrate is aligned with the mold;
   a measurement device, which includes a scope, configured to measure, via the scope and through the mold, a relative position, along the plane, between a mold mark formed on the mold and a substrate mark formed on the substrate in a state in which the mold and the imprint material are not in contact with each other; and
   a controller configured to control the second driving mechanism based on (i) information of a relationship between a moving amount and a change, the moving amount being a moving amount along the driving axis of at least one of the mold holder and the substrate holder, the change being change in the relative position along the plane between the mold mark and the substrate mark, (ii) information of the moving amount, and (iii) information of the relative position obtained by the measurement device before moving of at least one of the mold holder and the substrate holder by the first driving mechanism by the moving amount is started.

2. The apparatus according to claim 1, wherein the controller is configured to use information of an inclination of an optical axis of the scope relative to the driving axis, as the information of the relationship.

3. The apparatus according to claim 1, further comprising a position measurement device configured to measure a position of the mold holder moved by the first and second driving mechanisms along the plane in which the second driving mechanism is configured to move the mold holder, via a side surface of the mold holder,
   wherein the controller is configured to use information of an inclination of an optical axis of the scope relative to the side surface, as the information of the relationship.

4. The apparatus according to claim 3, further comprising a third driving mechanism configured to incline the mold holder such that a surface of the mold and a surface of a shot region of the substrate become parallel to each other,
   wherein the information of the inclination is information of the inclination of the optical axis of the scope relative to the side surface after the mold holder is inclined by the third driving mechanism.

5. The apparatus according to claim 1, wherein the controller is configured to obtain the information of the relationship based on information of a moving amount along the driving axis of at least one of the mold holder and the substrate holder, and information of change, corresponding to the moving amount, in the relative position between the mold mark and the substrate mark.

6. The apparatus according to claim 1, wherein the controller is configured to obtain the information of the relationship based on information of a moving amount along the driving axis of at least one of the mold holder and the substrate holder, and information of a relative position, corresponding to the moving amount, between the pattern and a shot region of the substrate.

7. The apparatus according to claim 1, wherein the controller is configured to obtain the information of the relationship if the imprint apparatus is activated or the scope is moved.

8. The apparatus according to claim 1, further comprising a correction mechanism configured to correct a dimension of the mold,
   wherein the controller is configured to control the correction mechanism based on the information of the relationship with respect to each of a plurality of pairs of the mold mark and the substrate mark, the information of the moving amount, and information of the relative position with respect to each of the plurality of pairs of the mold mark and the substrate mark obtained by the measurement device.

9. The apparatus according to claim 8, wherein the measurement device includes a plurality of ones of the scope, and the plurality of ones of the scope are configured to respectively detect the plurality of pairs of the mold mark and the substrate mark.

10. The apparatus according to claim 1, further comprising a position measurement device configured to measure a position of the substrate holder moved by the first and second driving mechanisms along the plane in which the second driving mechanism is configured to move the substrate holder, via a side surface of the substrate holder, wherein the controller is configured to use information of an inclination of an optical axis of the scope relative to the side surface, as the information of the relationship.

11. The apparatus according to claim 4, further comprising a third driving mechanism configured to incline the substrate holder such that a surface of the mold and a surface of a shot region of the substrate become parallel to each other, wherein the information of the inclination is information of the inclination of the optical axis of the scope relative to the side surface after the substrate holder is inclined by the third driving mechanism.

* * * * *